(12) United States Patent
Murai et al.

(10) Patent No.: US 8,217,255 B2
(45) Date of Patent: Jul. 10, 2012

(54) METHOD OF PRODUCING THERMOELECTRIC CONVERSION ELEMENT

(75) Inventors: Junya Murai, Susono (JP); Takuji Kita, Numazu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 819 days.

(21) Appl. No.: 12/332,760

(22) Filed: Dec. 11, 2008

(65) Prior Publication Data
US 2009/0151766 A1    Jun. 18, 2009

(30) Foreign Application Priority Data
Dec. 14, 2007   (JP) .................................. 2007-323436

(51) Int. Cl.
*H01L 37/00*  (2006.01)
*H01L 35/12*  (2006.01)
(52) U.S. Cl. ...................... 136/201; 136/200; 136/236.1
(58) Field of Classification Search .................. 136/201, 136/200, 236.1
See application file for complete search history.

(56) References Cited

U.S. PATENT DOCUMENTS
2009/0314324 A1 * 12/2009 Murai et al. .................. 136/201

FOREIGN PATENT DOCUMENTS
JP    2000-261047    9/2000
WO   WO 2007/066820  *  6/2007

* cited by examiner

*Primary Examiner* — Basia Ridley
*Assistant Examiner* — Thanh-Truc Trinh
(74) *Attorney, Agent, or Firm* — Finnegan, Henderson, Farabow, Garrett & Dunner, LLP

(57) ABSTRACT

A method of producing a thermoelectric conversion element includes preparing a dispersion liquid by mixing slurry containing ceramic particles with salts of at least two elements that constitute a thermoelectric conversion material, and then, precipitating the at least two elements that constitute the thermoelectric conversion material on the ceramic particles in the dispersion liquid; performing washing; performing heating treatment; and performing sintering. Contact between a solution with a pH lower than 1 among solutions of the salts and the slurry containing the ceramic particles is avoided, or the solution with the pH lower than 1 contacts the slurry containing the ceramic particles for a first time when the at least two elements that constitute the thermoelectric conversion material are precipitated.

16 Claims, 5 Drawing Sheets

METHOD OF PRODUCING THERMOELECTRIC CONVERSION ELEMENT

INCORPORATION BY REFERENCE

The disclosure of Japanese Patent Application No. 2007-323436 filed on Dec. 14, 2007 including the specification, drawings and abstract is incorporated herein by reference in its entirety.

BACKGROUND OF THE INVENTION

1. Field of the Invention

The invention relates to a method of producing a thermoelectric conversion element that contains ceramic that is an insulating material.

2. Description of the Related Art

A thermoelectric conversion material converts thermal energy to electric energy, and converts electric energy to thermal energy. The thermoelectric conversion material is used to form a thermoelectric conversion element that is used as a thermoelectric cooling element or a thermoelectric generation element. The thermoelectric conversion material performs thermoelectric conversion using the Seebeck effect. The thermoelectric conversion performance of the thermoelectric conversion material is represented by the following equation (1) that is referred to as a performance index ZT.

$$ZT = \alpha^2 \sigma T/\kappa \quad (1)$$

(In the above equation, "$\alpha$" represents a Seebeck coefficient, "$\sigma$" represents an electrical conductivity, "$\kappa$" represents a thermal conductivity, and "T" represents a measured temperature).

As evident from the above equation (1), the Seebeck coefficient $\alpha$ and the electrical conductivity $\sigma$ of the used material need to be increased, and the thermal conductivity $\kappa$ of the used material needs to be decreased, to increase the thermoelectric conversion performance of the thermoelectric conversion material. Fine particles (inactive fine particles) that do not react with the base material of the thermoelectric conversion material may be added to particles of the starting material of the thermoelectric conversion material, to decrease the thermal conductivity $\kappa$ of the material. In this case, the inactive fine particles scatter phonons that are mainly responsible for thermal conduction in the thermoelectric conversion material, and thus, the thermal conductivity $\kappa$ is decreased.

However, in the conventional thermoelectric conversion material, an effect, which is caused by deterioration of property values other than the thermal conductivity $\kappa$, such as electrical resistivity, is greater than the effect caused by scattering the phonons using the inactive fine particles. This interferes with improvement of the performance of the thermoelectric conversion material. Therefore, for example, Japanese Patent Application Publication No. 2000-261047 (JP-A-2000-261047) describes a thermoelectric conversion material produced by preparing fine particles of a starting material; evenly dispersing fine particles of ceramic or the like, which do not react with a base material, in the fine particles of the starting material; and performing sintering.

According to the publication No. 2000-261047, because both of the starting material and the inactive fine particles are fine particles, the inactive fine particles are easily dispersed in the entire base material of the thermoelectric conversion material. Therefore, there is a high probability that the inactive fine particle exists between the particles of the starting material. This prevents crystallization of the particles of the base material. Also, the fine particles of the starting material and the inactive fine particles are prepared so that the ratio of the diameter of the fine particle of the starting material to the diameter of the inactive fine particle is approximately 1, that is, the size of the fine particle of the starting material is substantially equal to the size of the inactive fine particle. Therefore, the inactive fine particles are not unevenly dispersed, that is, the inactive fine particles are evenly dispersed in the thermoelectric conversion material. This suppresses the decreases in the other property values, such as the electrical resistivity, due to uneven distribution of the inactive fine particles.

However, because the nano-size particle has a large specific surface area, the nano-size particles are likely to agglutinate due to, for example, the van der Waals' force. Accordingly, when the particles of the thermoelectric conversion material and the inactive fine particles are simply mixed as in the above-described method, the inactive fine particles agglutinate, and accordingly, the inactive fine particles become the micron-size particles. Thus, it is not possible to disperse the nano-size inactive fine particles in the thermoelectric conversion material. As a result, the distance between the inactive fine particles is larger than a phonon mean free path, and thus, the thermal conductivity may not be sufficiently decreased.

In the above-described technology, the other property values, which are not directly related to the above-described equation (1), such as the electrical resistivity, are adjusted by evenly dispersing the inactive fine particles. However, in the equation (1), the electrical conductivity $\sigma$ and the thermal conductivity $\kappa$, which are directly related to the performance index ZT, are not examined. Therefore, in the above-described technology, the inactive fine particles are the micron-size particles. Also, the state in which the inactive fine particles are dispersed is not accurately examined.

Carriers (electrons or electron holes) contained in the thermoelectric conversion material transfer both of heat and electricity. Therefore, the electrical conductivity $\sigma$ is proportional to the thermal conductivity $\kappa$. Further, it is known that the electrical conductivity $\sigma$ is inversely proportional to the Seebeck coefficient $\alpha$. Accordingly, in general, even if the electrical conductivity $\sigma$ is increased, the thermal conductivity $\kappa$ is increased, and the Seebeck coefficient $\alpha$ is decreased. Also, because effective mass is inversely proportional to mobility, if the mobility is increased, the effective mass is decreased.

SUMMARY OF THE INVENTION

The invention provides a method of producing a thermoelectric conversion element with a high performance index, using slurry containing ceramic.

A first aspect of the invention relates to a method of producing a thermoelectric conversion element. The method includes preparing a dispersion liquid by mixing slurry containing ceramic particles with salts of at least two elements that constitute a thermoelectric conversion material, and then, precipitating the at least two elements that constitute the thermoelectric conversion material on the ceramic particles in the dispersion liquid; performing washing; performing heating treatment; and performing sintering. Contact between a solution with a pH lower than 1 among solutions of the salts and the slurry containing the ceramic particles is avoided, or the solution with the pH lower than 1 contacts the slurry containing the ceramic particles for a first time when the at least two elements that constitute the thermoelectric conversion material are precipitated.

Among the salts of the at least two elements that constitute the thermoelectric conversion material, the salt that dissolves to form the solution with the pH lower than 1 is prevented from contacting the slurry containing the ceramic particles until the salt is reduced. Thus, it is possible to prevent agglutination of the ceramic particles in the slurry, and to precipitate the at least two elements that constitute the thermoelectric conversion material on the dispersed ceramic particles.

The at least two elements that constitute the thermoelectric conversion material may be precipitated on the ceramic particles, by mixing a first solution prepared by mixing the salt that dissolves to form a solution with a pH equal to or higher than 1 with the slurry containing the ceramic particles, a second solution that contains the salt that dissolves to form the solution with the pH lower than 1, and a reducing agent-containing solution that contains a reducing agent.

The solution containing the salt that dissolves to form the solution with the pH lower than 1 is prepared separately from the slurry containing the ceramic particles. The salt that dissolves to form the solution with the pH lower than 1 contacts the ceramic particles for the first time when the salt is reduced by mixing the solution with the reducing agent-containing solution. Thus, it is possible to prevent agglutination of the ceramic particles in the slurry.

The first solution and the second solution may be simultaneously dropped into the reducing agent-containing solution.

The second solution and the reducing agent-containing solution may be simultaneously dropped into the first solution.

The first solution and the reducing agent-containing solution may be simultaneously dropped into the second solution.

A first solution, which is prepared by mixing the salt that dissolves to form a solution with a pH equal to or higher than 1 with the slurry containing the ceramic particles, may be mixed with a reducing agent-containing solution that contains a reducing agent, and particles of the element precipitated from a mixed solution of the first solution and the reducing agent-containing solution, or the mixed solution containing the precipitated particles may be mixed with a second solution that contains the salt that dissolves to form the solution with the pH lower than 1, and the reducing agent-containing solution.

A second solution that contains the salt that dissolves to form the solution with the pH lower than 1 may be mixed with a reducing agent-containing solution that contains a reducing agent, and particles of the element precipitated from a mixed solution of the second solution and the reducing agent-containing solution, or the mixed solution containing the precipitated particles may be mixed with a first solution prepared by mixing the salt that dissolves to form a solution with a pH equal to or higher than 1 with the slurry containing the ceramic particles.

After a first solution prepared by mixing the salt that dissolves to form a solution with a pH equal to or higher than 1 with the slurry containing the ceramic particles is mixed with a reducing agent-containing solution that contains a reducing agent so that the element of the salt that dissolves to form the solution with the pH equal to or higher than 1 is precipitated on the ceramic particles, the ceramic particles may be taken out, the element on the ceramic particles may be dissolved by mixing the ceramic particles with a second solution that contains the salt that dissolves to form the solution with the pH lower than 1, and then, the at least two elements that constitute the thermoelectric conversion material may be precipitated on the ceramic particles by mixing the second solution with the reducing agent-containing solution.

A second aspect of the invention relates to a method of producing a thermoelectric conversion element. The method includes preparing a dispersion liquid by mixing slurry containing ceramic particles with salts of at least two elements that constitute a thermoelectric conversion material, and then, precipitating the at least two elements that constitute the thermoelectric conversion material on the ceramic particles in the dispersion liquid; performing washing; performing heating treatment; and performing sintering. The at least two elements that constitute the thermoelectric conversion material are precipitated on the ceramic particles, by simultaneously mixing the slurry containing the ceramic particles, a solution that contains the salts of the at least two elements that constitute the thermoelectric conversion material, and the reducing agent-containing solution.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

Hereinafter, an embodiment of the invention will be described. In the embodiment, a thermoelectric conversion element, in which a fine insulating disperse phase is evenly dispersed, is produced by precipitating particles of raw materials of a thermoelectric conversion material on ceramic particles with the mean diameter of 1 to 100 nm, and then, performing sintering.

Ceramic nano-particles with nano-level diameters are generally sold as slurry in which the ceramic nano-particles are dispersed in solvent such as water. The ceramic nano-particles with the smallest mean diameter (5 nm) among the currently available ceramic nano-particles are also dispersed in water slurry. Thus, it is convenient to produce the thermoelectric conversion element in the above-described manner using the slurry containing the ceramic particles.

The ceramic particles are generally dispersed in the water solvent by adjusting pH. A solution of a salt of an element among elements that constitute the thermoelectric conversion material has a pH lower than 1, and exhibits strong acidity.

When the solution of the salt of the element of the thermoelectric conversion material is mixed with the slurry containing the ceramic particles, the pH of the slurry is changed, and the ceramic particles agglutinate. As a result, it is difficult to produce the thermoelectric conversion element in which a fine insulating disperse phase is evenly dispersed.

Figure 1:
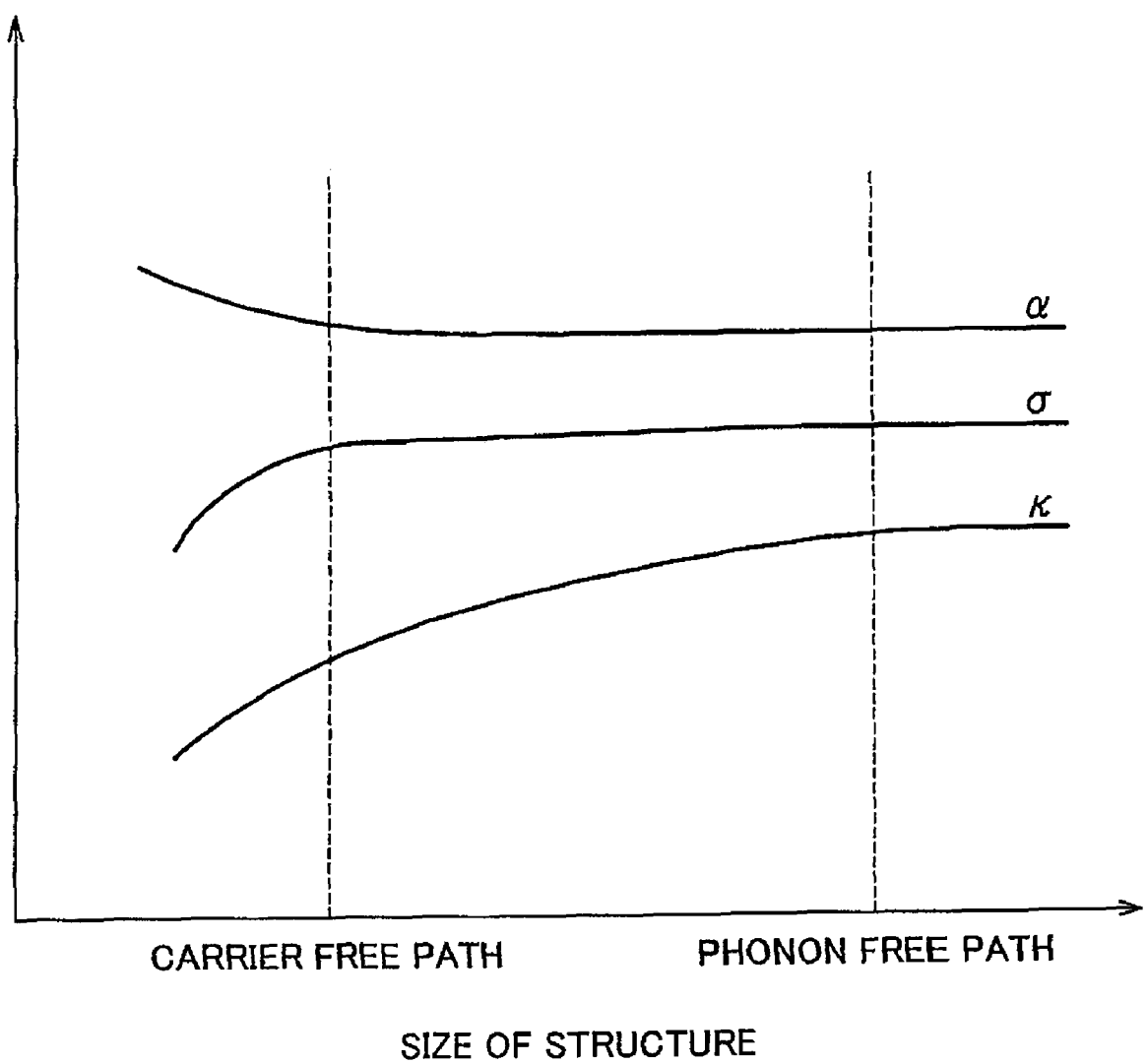
FIG. 1 is a graph showing a relation between the size of the structure of a thermoelectric conversion material, and a Seebeck coefficient $\alpha$, an electrical conductivity $\sigma$, or a thermal conductivity $\kappa$.

Thus, first, a relation between the performance index ZT and the structure of the thermoelectric conversion material will be described in detail with reference to FIG. 1. As shown in FIG. 1, as the size of the structure of the thermoelectric conversion material decreases from a phonon mean free path, the thermal conductivity κ gradually decreases. Accordingly, when the thermoelectric conversion material is designed so that the size of the structure is smaller than the phonon mean free path, the performance index ZT is increased.

Even when the size of the structure of the thermoelectric conversion material decreases from the phonon mean free path, the electrical conductivity σ of the thermoelectric conversion material does not decrease. When the particle diameter is substantially equal to or smaller than a carrier mean free path, the electrical conductivity σ decreases. Thus, the size of the structure of the thermoelectric conversion material is set so that the rate of decrease of the thermal conductivity κ is larger than the rate of decrease of the electrical conductivity σ, that is, the size of the structure of the thermoelectric conversion material is set to be equal to or larger than the carrier mean free path, and to be equal to or smaller than the phonon mean free path, using the fact that the size of the structure of the thermoelectric conversion material at which the thermal conductivity κ starts to decrease is different from the size of the structure of the thermoelectric conversion material at which the electric conductivity σ starts to decrease. Thus, the performance index ZT represented by the above-described equation (1) is further increased.

The size of the structure of the thermoelectric conversion material is defined by the diameter of the particle of the ceramic material that is the insulating material dispersed in the thermoelectric conversion material, or the distance between the ceramic particles. Accordingly, in the embodiment, the distance between the ceramic particles is controlled to obtain the above-described effect.

In the embodiment, first, a solution that contains the slurry containing the ceramic particles and salts of elements that constitute the thermoelectric conversion material is prepared.

As the ceramic material, materials that are ordinarily used, for example, alumina, zirconia, titania, magnesia, and silica, may be used. Among them, silica, zirconia, and titania may be preferably used, because silica, zirconia, and titania have low thermal conductivities. Also, particles of one ceramic material, or particles of two or more ceramic materials may be used. The specific resistance of the ceramic material is preferably larger than 1000 μΩm, more preferably equal to or larger than $10^6$ μΩm, and even more preferably equal to or larger than $10^{10}$ μΩm. When the specific resistance is equal to or lower than 1000 μΩm, the thermal conductivity is high, and the high thermal conductivity may interfere with improvement of the performance index ZT.

The mean diameter of the ceramic particles is equal to or smaller than the phonon mean free path. More specifically, the mean diameter of the ceramic particles is preferably in a range of 1 to 100 nm, and more preferably in a range of 10 to 100 nm. When the ceramic particles with the above-described diameters are used, the distance between the ceramic particles dispersed in the formed thermoelectric conversion element is equal to or smaller than the phonon mean free path in the ceramic material, and thus, the phonons are sufficiently scattered in the thermoelectric conversion material. Therefore, the thermal conductivity κ of the thermoelectric conversion material is decreased, and the performance index ZT is improved. In the embodiment, because the slurry containing the ceramic particles is used for reaction, it is possible to use the ceramic particles that are finer than particles of ceramic powder.

The medium in which the ceramic particles are dispersed may be an aqueous medium, or a non-aqueous medium such as alcohol. The proportion of the ceramic particles in the slurry is not limited to a specific value. That is, the proportion of the ceramic particles in the slurry may be set to any value, as long as the ceramic particles are sufficiently dispersed in the slurry. In general, the proportion of the ceramic particles in the slurry is preferably 0.1 to 20%.

The thermoelectric conversion material may be a P-type thermoelectric conversion material or a N-type thermoelectric conversion material. The P-type thermoelectric conversion material is not limited to a specific material. For example, $Bi_2Te_3$-based materials, PbTe-based materials, $Zn_4Sb_3$-based materials, $CoSb_3$-based materials, half-Heusler materials, full-Heusler materials, and SiGe-based materials may be used as the P-type thermoelectric conversion material. The N-type thermoelectric conversion material is not limited to a specific material, and known materials may be used as the N-type thermoelectric conversion material. For example, $Bi_2Te_3$-based materials, PbTe-based materials, $Zn_4Sb_3$-based materials, $CoSb_3$-based materials, half-Heusler materials, full-Heusler materials, SiGe-based materials, $Mg_2Si$-based materials, $Mg_2Sn$-based materials, and CoSi-based materials may be used as the N-type thermoelectric conversion material. Each of the solutions of the salts of Bi, Te, Sb, Si, and Sn among the elements of the above-described materials has a pH lower than 1. Each of the solutions of the salts of Pb, Zn, Co, Ge, and Ni has a pH equal to or higher than 1.

The output factor of the thermoelectric conversion material is preferably larger than 1 $mW/K^2$, more preferably equal to or larger than 2 $mW/K^2$, and even more preferably equal to or larger than 3 $mW/K^2$. When the output factor is equal to or smaller than 1 $mW/K^2$, the performance is not expected to be greatly improved. The thermal conductivity κ of the thermoelectric conversion material is preferably larger than 5 W/(m·K), more preferably equal to or larger than 7 W/(m·K), and even more preferably equal to or larger than 10 W/(m·K). Particularly when the thermal conductivity κ is larger than 5 W/(m·K), the significant advantageous effect of the invention is obtained. That is, when the size of the structure of the thermoelectric conversion material is controlled at the nano level, as the thermoelectric conversion material with the larger thermal conductivity κ is used, the thermal conductivity κ is decreased to a larger extent. Particularly when the thermoelectric conversion material with the thermal conductivity κ of 5 W/(m·K) or larger is used, the thermal conductivity κ is decreased more significantly.

For example, when the thermoelectric conversion material is $CoSb_3$, the salts of the elements that constitute the thermoelectric conversion material are cobalt chloride hydrate and antimony chloride. For example, when the thermoelectric conversion material is $(CoNi)Sb_3$, the salts of the elements that constitute the thermoelectric conversion material are cobalt chloride hydrate, nickel chloride, and antimony chloride.

For example, the solution of antimony chloride, which is one of the salts of the elements that constitute the thermoelectric conversion material, has a pH lower than 1, and exhibits strong acidity. Therefore, when the slurry containing the ceramic particles, which has the pH of approximately 4, is mixed with such a strong acid solution, the pH of the slurry is changed, and as a result, the ceramic particles agglutinate. Accordingly, in the embodiment, among the salts of the elements that constitute the thermoelectric conversion material, the salt that dissolves to form a solution with a pH lower than 1 does not directly contact the slurry containing the ceramic particles, and the salt that dissolves to form the solution with the pH lower than 1 contacts the slurry for the first time when the salts are reduced to the elements that constitute the thermoelectric conversion material.

It is known that the particles agglutinate when the pH is adjusted to the isoelectric point at which no net electric charge is carried on the surface of the particle. Even if the pH is not equal to the isoelectric point, when the pH is extremely low (pH<1), the layers of electric charge (double-layers of electric charge) on the surface of the particle are compressed, and as a result, the agglutinating force of the particle becomes stronger than an electric repulsive force. Therefore, agglutination occurs. This phenomenon occurs in any material.

More specifically, a first solution, a second solution, and a solution that contains a reducing agent (hereinafter, referred to as "reducing agent-containing solution") are mixed. The first solution is prepared by mixing the salt that dissolves to form a solution with a pH equal to or higher than 1 (examples of the salt include cobalt chloride hydrate and nickel chloride hydrate) among the salts of the elements that constitute the thermoelectric conversion material, with the slurry containing the ceramic particles. The second solution contains the salt that dissolves to form a solution with a pH lower than 1 (examples of the salt include antimony chloride, bismuth chloride, and tellurium chloride). When the slurry containing the ceramic particles, for example, the water slurry containing silica particles is mixed with cobalt chloride and/or nickel chloride, the silica particles are maintained in a dispersed state. However, when the water slurry containing the silica particles contacts the strong acid solution (with a pH lower than 1) such as the solution of antimony chloride, the silica particles strongly agglutinate. Therefore, the solution containing the salt that dissolves to form the solution with the pH lower than 1 is separated from the slurry containing the ceramic particles. The solution is mixed with, and contacts the slurry containing the ceramic particles for the first time when the salt is reduced. Thus, it is possible to prevent agglutination of the ceramic particles.

The first solution, the second solution, and the reducing agent-containing solution may be mixed in any one of the following manners. (1) The first solution and the second solution are simultaneously dropped into the reducing agent-containing solution; (2) the reducing agent-containing solution and the second solution are simultaneously dropped into the first solution; and (3) the reducing agent-containing solution and the first solution are simultaneously dropped into the second solution.

To achieve the above-described object, the first solution needs to contact the second solution at the final stage of a mixing process. More specifically, the first solution is mixed with the reducing agent-containing solution, and particles precipitated from the mixed solution of the first solution and the reducing agent-containing solution are taken out, and mixed with the second solution and the reducing agent-containing solution, or the mixed solution of the first solution and the reducing agent-containing solution, in which the precipitated particles are dispersed, is mixed with the second solution and the reducing agent-containing solution.

Further, the first solution, the second solution, and the reducing agent-containing solution may be mixed in any one of the following manners. (1-1) The first solution is dropped into the reducing agent-containing solution, and particles precipitated from the mixed solution of the first solution and the reducing agent-containing solution are taken out, and dispersed in the reducing agent-containing solution. Then, the reducing agent-containing solution, in which the particles are dispersed, is dropped into the second solution. (1-2) The first solution is dropped into the reducing agent-containing solution, and particles precipitated from the mixed solution of the first solution and the reducing agent-containing solution are taken out, and dispersed in the reducing agent-containing solution. Then, the second solution is dropped into the reducing agent-containing solution in which the particles are dispersed. (1-3) The reducing agent-containing solution is dropped into the first solution, and particles precipitated from the mixed solution of the reducing agent-containing solution and the first solution are taken out, and dispersed in the reducing agent-containing solution. Then, the reducing agent-containing solution, in which the particles are dispersed, is dropped into the second solution. (1-4) The reducing agent-containing solution is dropped into the first solution, and particles precipitated from the mixed solution of the reducing agent-containing solution and the first solution are taken out, and dispersed in the reducing agent-containing solution. Then, the second solution is dropped into the reducing agent-containing solution in which the particles are dispersed. (2-1) The second solution is dropped into the reducing agent-containing solution, and particles precipitated from the mixed solution of the second solution and the reducing agent-containing solution are taken out, and are dispersed in the reducing agent-containing solution. Then, the reducing agent-containing solution, in which the particles are dispersed, is dropped into the first solution. (2-2) The second solution is dropped into the reducing agent-containing solution, and particles precipitated from the mixed solution of the second solution and the reducing agent-containing solution are taken out, and dispersed in the reducing agent-containing solution. Then, the first solution is dropped into the reducing agent-containing solution in which the particles are dispersed. (2-3) The reducing agent-containing solution is dropped into the second solution, and particles precipitated from the mixed solution of the reducing agent-containing solution and the second solution are taken out, and dispersed in the reducing agent-containing solution. Then, the reducing agent-containing solution, in which the particles are dispersed, is dropped into the first solution. (2-4) The reducing agent-containing solution is dropped into the second solution, and particles precipitated from the mixed solution of the reducing agent-containing solution and the second solution are taken out, and dispersed in the reducing agent-containing solution. Then, the first solution is dropped into the reducing agent-containing solution in which the particles are dispersed. In each of the above-described cases, the particles precipitated from the mixed solution need not necessarily be taken out. That is, the mixed solution, in which the precipitated particles are dispersed, may be mixed with the reducing agent-containing solution and one of the first solution and the second solution, in the next process.

Further, the second solution may be mixed with the reducing agent-containing solution, and particles precipitated from the mixed solution of the second solution and the reducing agent-containing solution may be taken out, and mixed with the reducing agent-containing solution. Then, the reducing agent-containing solution, in which the particles are dispersed, may be mixed with the first solution. Also, the second solution may be mixed with the reducing agent-containing solution, and the mixed solution of the second solution and the reducing agent-containing solution, in which precipitated particles are dispersed, may be mixed with the reducing agent-containing solution, and then, mixed with the first solution. Also, the second solution may be mixed with the reducing agent-containing solution, and particles precipitated from the mixed solution of the second solution and the reducing agent-containing solution may be taken out, and mixed with the first solution. Then, the first solution, in which the particles are dispersed, may be mixed with the reducing agent-containing solution. Also, the second solution may be mixed with the reducing agent-containing solution, and the mixed solution of the second solution and the reducing agent-containing solution, in which the particles are dispersed, may be mixed with the first solution, and then, the reducing agent-containing solution.

Further, the first solution may be mixed with the reducing agent-containing solution, and particles precipitated from the mixed solution of the first solution and the reducing agent-containing solution may be taken out, and mixed with the second solution. Then, the second solution, in which the particles are dispersed, may be mixed with the reducing agent-containing solution. Also, the first solution may be mixed with the reducing agent-containing solution, and the mixed solution of the first solution and the reducing agent-containing solution, in which precipitated particles are dispersed, may be mixed with the second solution, and then, mixed with the reducing agent-containing solution. In these cases, the particles of the element of the thermoelectric material are precipitated from the salt in the first solution, which dissolves to form the solution with the pH equal to or higher than 1. When the particles are added to the second solution, the particles are dissolved in the strong acid second solution with the pH lower than 1. Then, the component of the thermoelectric material, which has been in the first solution, is homogenously mixed with the component of the thermoelectric material in the second solution, and the elements of the thermoelectric material are precipitated.

In the case where a non-aqueous medium such as ethanol is used as the medium for the ceramic slurry, when the slurry contacts the solution of the salt of the element of the thermoelectric conversion material, which exhibits strong acidity, the ceramic particles in the slurry agglutinate. When the slurry contacts the solution of sodium borohydride that functions as the reducing agent, the ceramic particles also agglutinate. Therefore, the slurry containing the ceramic particles, a solution that contains the salts of at least two elements that constitute the thermoelectric conversion material, and the reducing agent-containing solution may be simultaneously mixed.

In the invention, any reducing agent may be used, as long as the reducing agent reduces the ions of the elements that constitute the thermoelectric conversion material. For example, $NaBH_4$ and hydrazine may be used.

The salts of the at least two elements that constitute the thermoelectric conversion material are mixed at a ratio at which the intended thermoelectric conversion material is produced. The ratio of the ceramic particles to the thermoelectric conversion material is adjusted so that the ratio of the volume of the ceramic particles to the volume of the thermoelectric conversion material is 1 to 50%.

There are ions of raw materials of the thermoelectric conversion material, for example, Co ions and Sb ions in a dispersion liquid containing the salts of the elements that constitute the thermoelectric conversion material. Accordingly, when the dispersion liquid is mixed with the reducing agent-containing solution, these ions are reduced, and thus, the particles of the elements that constitute the thermoelectric conversion material, for example, Co particles and Sb particles are precipitated. When the elements are precipitated, by-products, such as NaCl and $NaBO_3$, are produced, in addition to the Co particles and Sb particles. To remove the by-products, filtration may be performed after the elements that constitute the thermoelectric conversion material are precipitated. Further, after the filtration is performed, the by-produces may be washed off with alcohol or water.

When the ions of the raw materials are reduced, and the particles of the elements that constitute the thermoelectric conversion material are precipitated, there are the ceramic particles with a small diameter in the dispersion liquid. Therefore, the ceramic particles with a small diameter, and the particles of the elements that constitute the thermoelectric conversion material are evenly dispersed in the dispersion liquid.

The thermoelectric conversion material is formed by alloying the elements that constitute the thermoelectric conversion material by performing heating treatment, preferably hydrothermal treatment on the dispersion liquid. Then, the thermoelectric conversion material is dried. Thus, it is possible to produce an aggregate in which the ceramic particles and the particles of the thermoelectric conversion material are evenly mixed. After the aggregate is washed and dried as required, spark plasma sintering (SPS) is performed on the aggregate, for example, at 580° C. according to an ordinary sintering method. Thus, it is possible to produce the thermoelectric conversion element in which the ceramic particles are dispersed to form the disperse phase in a continuous phase of the thermoelectric conversion material.

The method of producing the thermoelectric conversion material according to the embodiment makes it possible to control the size of the structure (the diameter of the particle of the insulating material or the distance between the particles of the insulating material) at the nano level. That is, by using the slurry containing the ceramic particles, it is possible to disperse, between the particles of the thermoelectric conversion material, the ceramic particles with a mean diameter smaller than the mean diameter of the particle of the ceramic powder. Thus, the size of the structure of the thermoelectric conversion element (i.e., the distance between the ceramic particles) is equal to or smaller than the phonon mean free path, preferably equal to or larger than the carrier mean free path and equal to or smaller than the phonon mean free path. Thus, the phonons are sufficiently scattered in the thermoelectric conversion element, and accordingly, the thermal conductivity κ is decreased. As a result, the thermoelectric conversion element exhibits the high performance index ZT represented by the equation (1). According to the method of producing the thermoelectric conversion element in the embodiment, it is also possible to produce the excellent thermoelectric conversion element with the high performance index ZT, that is, the thermoelectric conversion element with the performance index ZT higher than 2, which has been difficult to produce.

FIRST EXAMPLE

After 0.895 g of cobalt chloride hexahydrate ($CoCl_2.6H_2O$) and 0.057 g of nickel chloride hexahydrate ($NiCl_2.6H_2O$) were added to, and dissolved in 50 mL of ethanol to prepare a solution, 4 g of water slurry containing 10% by weight of $SiO_2$ (produced by ADMATECHS CO., LTD) was added to the solution. Thus, the first solution was prepared. The diameters of the particles of $SiO_2$ were 1 to 20 nm. The center of the distribution of the particle diameters was 5 nm. The first solution had the pH of 4. Also, 2.739 g of antimony chloride ($SbCl_3$) was added to, and dissolved in 50 mL of ethanol, and thus, the second solution was prepared.

The second solution had a pH lower than 1. Further, 3.3 g of sodium borohydride ($NaBH_4$) that functions as the reducing agent was added to 100 mL of ethanol, and thus, the reducing agent-containing solution was prepared. The first solution and the second solution were simultaneously added to the reducing agent-containing solution. Then, impurities were removed by performing washing using the mixed solution of ethanol and water, and hydrothermal synthesis was performed at 240° C. for 24 hours. Thus, a $Co_{0.94}Ni_{0.06}Sb_3$ compound, which is the thermoelectric conversion material, was formed on the ceramic particles. The composite particles thus produced were placed in a die, and the spark plasma sintering (SPS) was performed at 500° C. Thus, the thermoelectric conversion element was produced.

SECOND EXAMPLE

The thermoelectric conversion material was produced in the same manner as the manner in the first example, except that the second solution and the reducing agent-containing solution were simultaneously added to the first solution.

THIRD EXAMPLE

The thermoelectric conversion material was produced in the same manner as the manner in the first example, except that the first solution and the reducing agent-containing solution were simultaneously added to the second solution.

FIRST COMPARATIVE EXAMPLE

The thermoelectric conversion element was produced in the same manner as the manner in the first example, except that the first solution was mixed with the second solution, and then, the mixed solution of the first solution and the second solution was added to the reducing agent-containing solution. In this example, it was visually observed that the ceramic particles agglutinated.

Figure 2:
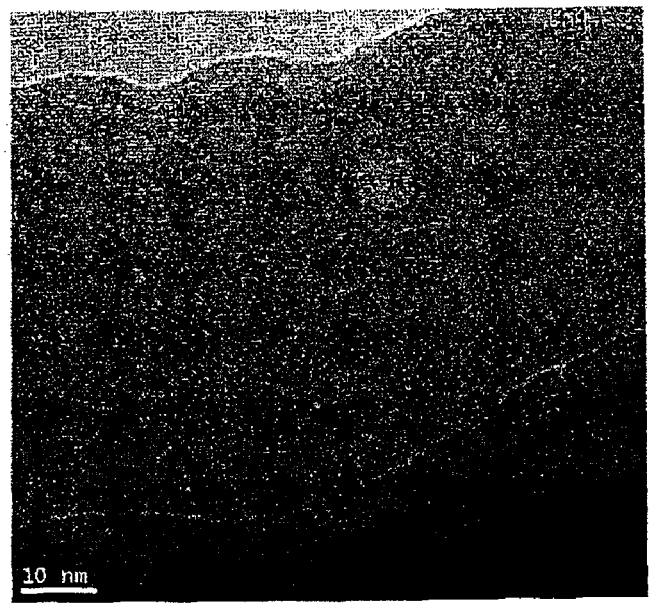
FIG. 2 is the TEM image of a thermoelectric conversion element according to the invention, which was produced in a first example.
Figure 3:
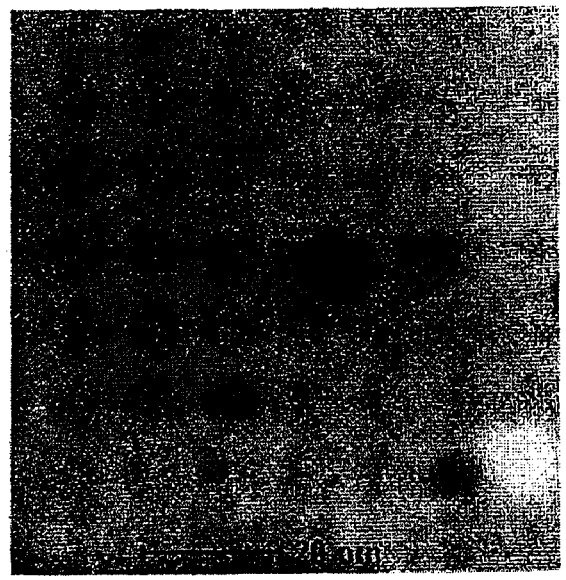
FIG. 3 is the TEM image of the thermoelectric conversion element according to the invention, which was produced in a second example.
Figure 4:
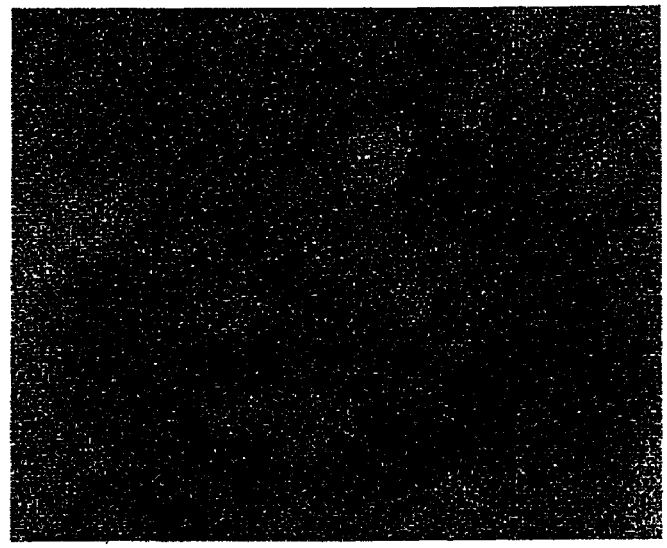
FIG. 4 is the TEM image of the thermoelectric conversion element according to the invention, which was produced in a third example.
Figure 5:
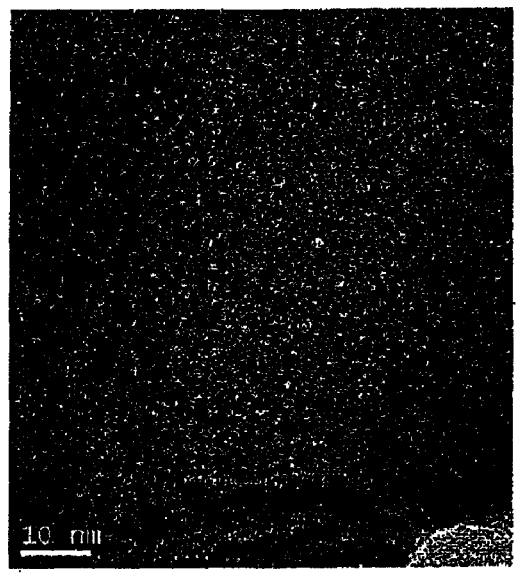
FIG. 5 is the TEM image of the thermoelectric conversion element according to the invention, which was produced in a sixteenth example.
Figure 6:
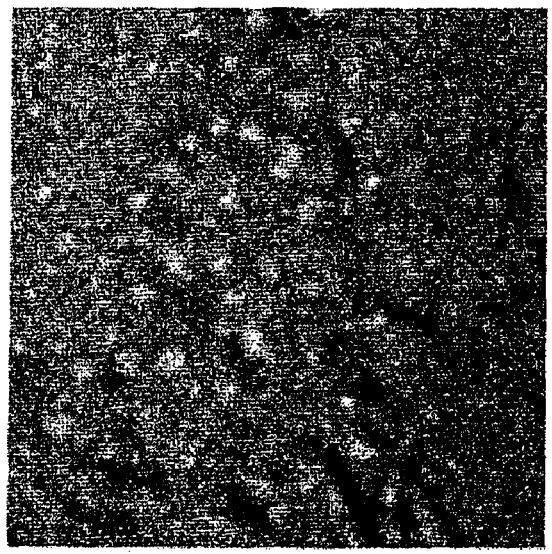
FIG. 6 is the TEM image of the thermoelectric conversion element according to the invention, which was produced in a seventeenth example.
Figure 7:
FIG. 7 is the TEM image of the thermoelectric conversion element according to the invention, which was produced in an eighteenth example.
Figure 8:
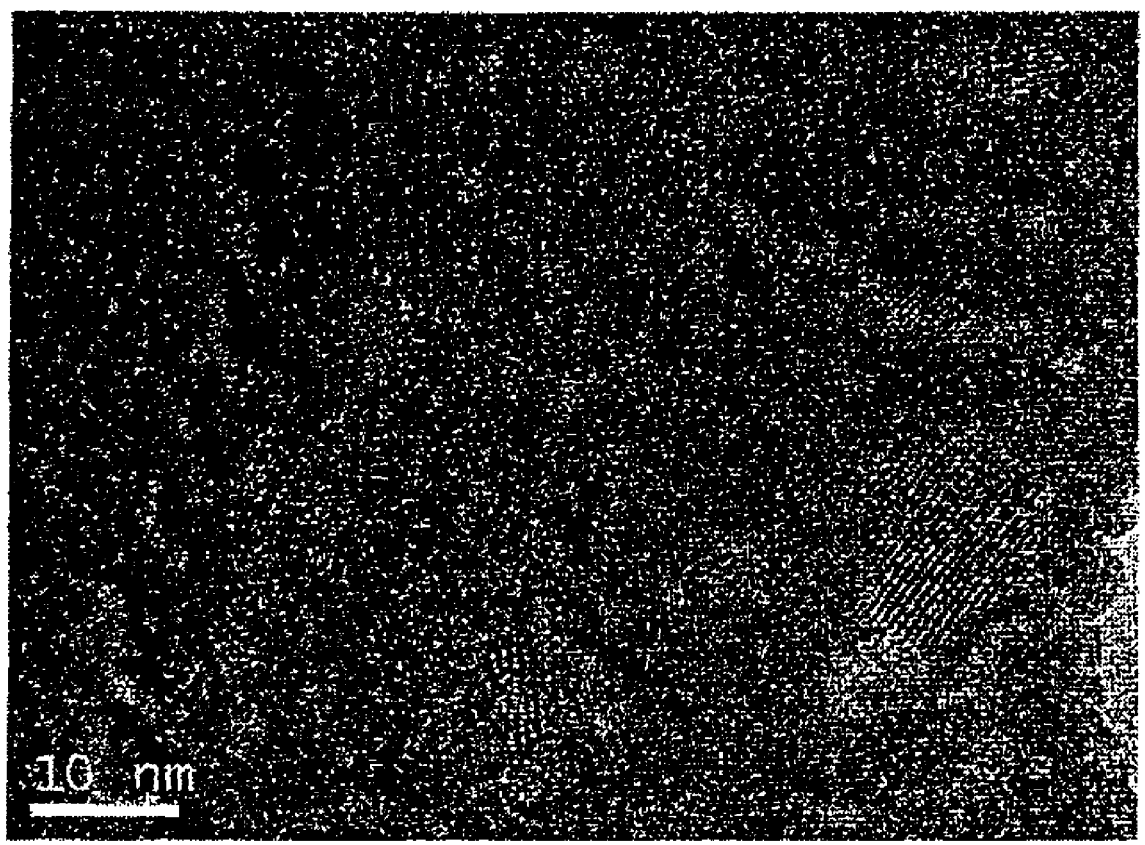
FIG. 8 is the TEM image of the thermoelectric conversion element according to the invention, which was produced in a nineteenth example.

FIG. 2 to FIG. 4 show the transmission electron microscopic images (TEM images) of the thermoelectric conversion elements produced in the first to third examples, respectively. In each of the thermoelectric conversion elements produced in the first to third examples, the small silica particles with diameters of 2 to 15 nm were dispersed in the thermoelectric conversion material. The following table 1 shows the measured thermal conductivity and the measured Seebeck coefficient of the thermoelectric conversion element produced in each of the first to third examples and the first comparative example.

TABLE 1

|  | Thermal Conductivity (W/m · K) | Seebeck Coefficient (μV/K) |
| --- | --- | --- |
| First Example | 0.85 | −181 |
| Second Example | 0.92 | −158 |
| Third Example | 0.90 | −165 |
| First Comparative Example | 2.8 | −61 |

FOURTH EXAMPLE

After 0.895 g of cobalt chloride hexahydrate and 0.057 g of nickel chloride hexahydrate were added to, and dissolved in 50 mL of ethanol to prepare a solution, 2.6 g of water slurry containing 10% of $SiO_2$ was added to the solution. Thus, the first solution was prepared. The diameters of the particles of $SiO_2$ were 1 to 20 nm. The center of the distribution of the particle diameters was 5 nm. The first solution had the pH of 4. The first solution was dropped into the reducing agent-containing solution that is prepared by adding 3.3 g of sodium borohydride that functions as the reducing agent to 100 mL of ethanol. Thus, cobalt and nickel were precipitated on the silica particles. The silica particles were taken out, and added to another reducing agent-containing solution to prepare a solution containing the silica particles. Then, the second solution, which was prepared by adding 2.739 g of antimony chloride to 50 mL of ethanol, and dissolving the antimony chloride, was dropped into the solution containing the silica particles. The second solution had a pH lower than 1. Then, impurities were removed by performing washing using the mixed solution of ethanol and water, and hydrothermal synthesis was performed at 240° C. for 24 hours. Thus, a $Co_{0.94}Ni_{0.06}Sb_3$ compound, which is the thermoelectric conversion material, was formed on the ceramic particles. The composite particles thus produced were placed in a device, and the spark plasma sintering (SPS) was performed at 600° C. Thus, the thermoelectric conversion element was produced.

FIFTH EXAMPLE

The thermoelectric conversion element was produced in the same manner as the manner in the fourth example, except that the reducing agent-containing solution was dropped into the first solution, instead of dropping the first solution into the reducing agent-containing solution.

SIXTH EXAMPLE

The thermoelectric conversion element was produced in the same manner as the manner in the fourth example, except that the solution, which was prepared by adding the silica particles that were taken out to the reducing agent-containing solution, was dropped into the second solution, instead of dropping the second solution into the solution containing the silica particles.

SEVENTH EXAMPLE

The thermoelectric conversion element was produced in the same manner as the manner in the fifth example, except that the solution, which was prepared by adding the silica particles that were taken out to the reducing agent-containing solution, was dropped into the second solution, instead of dropping the second solution into the solution containing the silica particles.

EIGHTH EXAMPLE

The reducing agent-containing solution was dropped into the second solution, and thus, particles of the element (antimony) of the salt (antimony chloride), which dissolves to form the solution with the pH lower than 1, were produced. After the produced particles were added to the first solution, the first solution was dropped into the reducing agent-containing solution. Then, washing, heating treatment, and sintering were performed as in the fourth example. Thus, the thermoelectric conversion element was produced.

NINTH EXAMPLE

The second solution was dropped into the reducing agent-containing solution, and thus, particles of the element (antimony) of the salt (antimony chloride), which dissolves to form the solution with the pH lower than 1, were produced. After the produced particles were added to the reducing agent-containing solution, the reducing agent-containing solution was dropped into the first solution. Then, washing, heating treatment, and sintering were performed as in the fourth example. Thus, the thermoelectric conversion element was produced.

TENTH EXAMPLE

The second solution was dropped into the reducing agent-containing solution, and thus, particles of the element (antimony) of the salt (antimony chloride), which dissolves to form the solution with the pH lower than 1, were produced. After the produced particles were added to the first solution, the first solution was dropped into the reducing agent-containing solution. Then, washing, heating treatment, and sintering were performed as in the fourth example. Thus, the thermoelectric conversion element was produced.

ELEVENTH EXAMPLE

The reducing agent-containing solution was dropped into the second solution, and thus, particles of the element (antimony) of the salt (antimony chloride), which dissolves to form the solution with the pH lower than 1, were produced. After the produced particles were added to the reducing agent-containing solution, the reducing agent-containing solution was dropped into the first solution. Then, washing, heating treatment, and sintering were performed as in the fourth example. Thus, the thermoelectric conversion element was produced.

TWELFTH EXAMPLE

The reducing agent-containing solution was dropped into the second solution, and thus, particles were produced. After the produced particles were added to the reducing agent-containing solution, the first solution was dropped into the reducing agent-containing solution. Then, washing, heating treatment, and sintering were performed as in the fourth example. Thus, the thermoelectric conversion element was produced.

THIRTEENTH EXAMPLE

The reducing agent-containing solution was dropped into the second solution, and thus, particles were produced. After the produced particles were added to the first solution, the reducing agent-containing solution was dropped into the first solution. Then, washing, heating treatment, and sintering were performed as in the fourth example. Thus, the thermoelectric conversion element was produced.

FOURTEENTH EXAMPLE

The second solution was dropped into the reducing agent-containing solution, and thus, particles were produced. After the produced particles were added to the reducing agent-containing solution, the first solution was dropped into the reducing agent-containing solution. Then, washing, heating treatment, and sintering were performed as in the fourth example. Thus, the thermoelectric conversion element was produced.

FIFTEENTH EXAMPLE

The second solution was dropped into the reducing agent-containing solution, and thus, particles were produced. After the produced particles were added to the first solution, the reducing agent-containing solution was dropped into the first solution. Then, washing, heating treatment, and sintering were performed as in the fourth example. Thus, the thermoelectric conversion element was produced.

The following tables 2 and 3 show the result of EPMA quantitative analysis (quantitative analysis using an electron probe X-ray micro analyzer) and the Seebeck coefficient of the thermoelectric conversion element produced in each of the examples and the first comparative example.

TABLE 2

|  | Fourth Example | Fifth Example | Sixth Example | Seventh Example | Eighth Example | Ninth Example |
|---|---|---|---|---|---|---|
| Co | 21.866 | 10.085 | 10.706 | 10.958 | 10.402 | 12.803 |
| Ni | 1.078 | 0.595 | 0.807 | 0.707 | 0.795 | 0.796 |
| Sb | 70.231 | 32.126 | 34.010 | 37.034 | 34.001 | 41.256 |
| Co + Ni | 22.944 | 10.680 | 11.513 | 11.665 | 11.197 | 13.600 |
| Sb/(Co + Ni) | 3.061 | 3.008 | 2.954 | 3.175 | 3.037 | 3.034 |
| Seebeck Coefficient ($\mu$V/K) | −202 | −182 | −195 | −184 | −203 | −172 |

TABLE 3

|  | Tenth Example | Eleventh Example | Twelfth Example | Thirteenth Example | Fourteenth Example | Fifteenth Example | First comparative example |
|---|---|---|---|---|---|---|---|
| Co | 21.537 | 22.805 | 11.731 | 11.162 | 10.840 | 10.253 | 10.402 |
| Ni | 0.889 | 0.682 | 0.875 | 0.673 | 0.756 | 0.704 | 0.795 |
| Sb | 69.123 | 72.521 | 38.212 | 35.909 | 34.372 | 34.374 | 15.201 |
| Co + Ni | 22.426 | 23.487 | 12.606 | 11.835 | 11.596 | 10.957 | 11.197 |
| Sb/(Co + Ni) | 3.082 | 3.088 | 3.031 | 3.034 | 2.964 | 3.137 | 1.358 |
| Seebeck Coefficient ($\mu$V/K) | −182 | −199 | −179 | −183 | −192 | −172 | −42 |

SIXTEENTH EXAMPLE

The first solution was dropped into the reducing agent-containing solution, and thus, the elements (cobalt and nickel) of the salts dissolved in the first solution were precipitated on particles. After the produced particles were added to the second solution, and the elements precipitated on the particles were dissolved in the second solution, the reducing agent-containing solution was dropped into the second solution to precipitate both the elements (cobalt and nickel) of the salts dissolved in the first solution and the element (antimony) of the salt dissolved in the second solution. Then, washing, heating treatment, and sintering were performed as in the fourth example. Thus, the thermoelectric conversion element was produced.

SEVENTEENTH EXAMPLE

The reducing agent-containing solution was dropped into the. first solution, and thus, the elements (cobalt and nickel) of the salts dissolved in the first solution were precipitated on particles. After the produced particles were added to the second solution, the reducing agent-containing solution was dropped into the second solution to precipitate both the elements (cobalt and nickel) of the salts dissolved in the first solution and the element (antimony) of the salt dissolved in the second solution. Then, washing, heating treatment, and sintering were performed as in the fourth example. Thus, the thermoelectric conversion element was produced.

EIGHTEENTH EXAMPLE

The reducing agent-containing solution was dropped into the first solution, and thus, the elements (cobalt and nickel) of the salts dissolved in the first solution were precipitated on particles. After the produced particles were added to the second solution, the second solution was dropped into the reducing agent-containing solution to precipitate both the elements (cobalt and nickel) of the salts dissolved in the first solution and the element (antimony) of the salt dissolved in the second solution. Then, washing, heating treatment, and sintering were performed as in the fourth example. Thus, the thermoelectric conversion element was produced.

NINETEENTH EXAMPLE

The first solution was dropped into the reducing agent-containing solution, and thus, the elements (cobalt and nickel) of the salts dissolved in the first solution were precipitated on particles. After the produced particles were added to the second solution, the second solution was dropped into the reducing agent-containing solution to precipitate both the elements (cobalt and nickel) of the salts dissolved in the first solution and the element (antimony) of the salt dissolved in the second solution. Then, washing, heating treatment, and sintering were performed as in the fourth example. Thus, the thermoelectric conversion element was produced.

FIG. 5 to FIG. 8 show the TEM images of the thermoelectric conversion elements produced in the sixteenth to nineteenth examples, respectively. In each of thermoelectric conversion elements produced in the sixteenth to nineteenth examples, the small silica particles with diameters of 2 to 10 nm were dispersed in the thermoelectric conversion material.

TWENTIETH EXAMPLE

A metal salt solution was prepared by adding 0.895 g of cobalt chloride hexahydrate, 0.057 g of nickel chloride hexahydrate, and 2.739 g of antimony chloride to 100 mL of ethanol, and dissolving the cobalt chloride hexahydrate, the nickel chloride hexahydrate, and the antimony chloride in the ethanol. The reducing agent-containing solution was prepared by adding 3.3 g of sodium borohydride, which functions as the reducing agent, to 100 mL of ethanol. The metal salt solution and the reducing agent-containing solution were simultaneously dropped into 2.6 g of slurry containing. 10% of $SiO_2$ in 1-methoxy-2-propanol. Then, washing, heating treatment, and sintering were performed as in the fourth example. Thus, the thermoelectric conversion element was produced.

TWENTY-FIRST EXAMPLE

The thermoelectric conversion element was produced in the same manner as the manner in the twentieth example, except that the slurry containing $SiO_2$ and the reducing agent-containing solution were simultaneously dropped into the metal salt solution.

TWENTY-SECOND EXAMPLE

The thermoelectric conversion element was produced in the same manner as the manner in the twentieth example, except that the slurry containing $SiO_2$ and the metal salt solution were simultaneously dropped into the reducing agent-containing solution.

TWENTY-THIRD EXAMPLE

The thermoelectric conversion element was produced in the same manner as the manner in the twentieth example, except that the slurry containing $SiO_2$, the metal salt solution, and the reducing agent-containing solution were simultaneously mixed.

In each of the thermoelectric conversion elements produced in the twentieth to twenty-third examples, the small silica particles with diameters of 2 to 15 nm were dispersed in the thermoelectric conversion material.

In each of the twentieth to twenty-third examples, a metal salt solution was prepared by dissolving all of cobalt chloride hexahydrate, nickel chloride hexahydrate, and antimony chloride in ethanol. However, a solution of cobalt chloride hexahydrate, a solution of nickel chloride hexahydrate, and a solution of antimony chloride may be separately prepared, and the solutions, the ceramic slurry, and the reducing agent-containing solution may be simultaneously mixed, as in the twentieth to twenty-third examples.

While some embodiments of the invention have been illustrated above, it is to be understood that the invention is not limited to details of the illustrated embodiments, but may be embodied with various changes, modifications or improvements, which may occur to those skilled in the art, without departing from the spirit and scope of the invention.

What is claimed is:

1. A method of producing a thermoelectric conversion element, comprising:
   preparing a dispersion liquid by mixing slurry containing ceramic particles with salts of at least two elements that constitute a thermoelectric conversion material, and then, precipitating the at least two elements that constitute the thermoelectric conversion material on the ceramic particles in the dispersion liquid, wherein the preparing comprises preparing a first solution prepared by mixing a salt that dissolves to form a solution with a pH equal to or higher than 1 with the slurry containing the ceramic particles, and a second solution that contains a salt that dissolves to form a solution with the pH lower than 1;

performing washing;

performing heating treatment; and performing sintering, wherein contact between the second solution among solutions of the salts and the slurry containing the ceramic particles is avoided, or the second solution contacts the slurry containing the ceramic particles for a first time when the at least two elements that constitute the thermoelectric conversion material are precipitated.

2. The method according to claim 1, wherein the at least two elements that constitute the thermoelectric conversion material are precipitated on the ceramic particles, by mixing the first solution, the second solution, and a reducing agent-containing solution that contains a reducing agent.

3. The method according to claim 2, wherein the first solution and the second solution are simultaneously dropped into the reducing agent-containing solution.

4. The method according to claim 2, wherein the second solution and the reducing agent-containing solution are simultaneously dropped into the first solution.

5. The method according to claim 2, wherein the first solution and the reducing agent-containing solution are simultaneously dropped into the second solution.

6. The method according to claim 1, wherein the first solution is mixed with a reducing agent-containing solution that contains a reducing agent, and the second solution and the reducing agent-containing solution are mixed with particles of the element precipitated from a mixed solution of the first solution and the reducing agent-containing solution, or the mixed solution containing the precipitated particles.

7. The method according to claim 1, wherein the second solution is mixed with a reducing agent-containing solution that contains a reducing agent, and the first solution is mixed with particles of the element precipitated from a mixed solution of the second solution and the reducing agent-containing solution, or the mixed solution containing the precipitated particles.

8. The method according to claim 7, wherein the second solution is mixed with the reducing agent-containing solution, and the first solution is mixed with the particles precipitated from the mixed solution of the second solution and the reducing agent-containing solution, or the mixed solution containing the precipitated particles, and then, mixed with the reducing agent-containing solution.

9. The method according to claim 7, wherein the second solution is mixed with the reducing agent-containing solution, and the reducing agent-containing solution is mixed with the particles precipitated from the mixed solution of the second solution and the reducing agent-containing solution, or the mixed solution containing the precipitated particles, and then, mixed with the first solution.

10. The method according to claim 1, wherein after the first solution is mixed with a reducing agent-containing solution that contains a reducing agent so that the element of the salt that dissolves to form the solution with the pH equal to or higher than 1 is precipitated on the ceramic particles, the ceramic particles are taken out, the element on the ceramic particles is dissolved by mixing the ceramic particles with the second solution, and then, the at least two elements that constitute the thermoelectric conversion material are precipitated on the ceramic particles by mixing the second solution with the reducing agent-containing solution.

11. The method according to claim 1, wherein the salt that dissolves to form the solution with the pH lower than 1 is selected from the group consisting of antimony chloride, bismuth chloride, and tellurium chloride.

12. The method according to claim 1, wherein the salt that dissolves to form the solution with the pH equal to or higher than 1 includes cobalt chloride and nickel chloride.

13. The method according to claim 2, wherein the reducing agent is sodium borohydride.

14. A method of producing a thermoelectric conversion element, comprising:

preparing a dispersion liquid by mixing slurry containing ceramic particles with salts of at least two elements that constitute a thermoelectric conversion material, and then, precipitating the at least two elements that constitute the thermoelectric conversion material on the ceramic particles in the dispersion liquid, wherein the preparing comprises preparing a first solution prepared by mixing a salt that dissolves to form a solution with a pH equal to or higher than 1 with the slurry containing the ceramic particles, and a second solution that contains a salt that dissolves to form a solution with the pH lower than 1;

performing washing;

performing heating treatment; and performing sintering, wherein the at least two elements that constitute the thermoelectric conversion material are precipitated on the ceramic particles, by simultaneously mixing the slurry containing the ceramic particles, a solution that contains the salts of the at least two elements that constitute the thermoelectric conversion material, and the a reducing agent-containing solution.

15. The method according to claim 14, wherein the salts of the at least two elements that constitute the thermoelectric conversion material include at least one selected from the group consisting of antimony chloride, bismuth chloride, and tellurium chloride, and at least one selected from the group consisting of cobalt chloride and nickel chloride.

16. The method according to claim 14, wherein the reducing agent is sodium borohydride.

* * * * *